US007994029B2

(12) United States Patent
Cheng et al.

(10) Patent No.: US 7,994,029 B2
(45) Date of Patent: Aug. 9, 2011

(54) METHOD FOR PATTERNING CRYSTALLINE INDIUM TIN OXIDE USING FEMTOSECOND LASER

(75) Inventors: Chung-Wei Cheng, Miaoli County (TW); Costas P. Grigoropoulos, Berkeley, CA (US); David Jen Hwang, El Cerrito, CA (US); Moosung Kim, Emeryville, CA (US)

(73) Assignees: Industrial Technology Research Institute, Hsin-Chu (TW); The Regents of the University of California, Oakland, CA (US)

( * ) Notice: Subject to any disclaimer, the term of this patent is extended or adjusted under 35 U.S.C. 154(b) by 345 days.

(21) Appl. No.: 12/358,046

(22) Filed: Jan. 22, 2009

(65) Prior Publication Data

US 2009/0221141 A1 Sep. 3, 2009

(30) Foreign Application Priority Data

Feb. 29, 2008 (TW) ................................ 97107130 A

(51) Int. Cl.
*H01L 21/20* (2006.01)
*H01L 21/36* (2006.01)
*H01L 21/44* (2006.01)

(52) U.S. Cl. ........................................ 438/487; 438/609

(58) Field of Classification Search .................. 438/487, 438/609

See application file for complete search history.

(56) References Cited

U.S. PATENT DOCUMENTS

| | | | | |
|---|---|---|---|---|
| 6,448,158 | B2 * | 9/2002 | Peng et al. | 438/487 |
| 6,593,593 | B2 | 7/2003 | Shinohara et al. | |
| 2005/0206825 | A1 * | 9/2005 | Kaneko et al. | 349/141 |
| 2005/0226287 | A1 * | 10/2005 | Shah et al. | 372/25 |

* cited by examiner

*Primary Examiner* — Ha Tran T Nguyen
*Assistant Examiner* — Aaron Dehne
(74) *Attorney, Agent, or Firm* — WPAT, PC; Justin King

(57) ABSTRACT

A method for patterning crystalline indium tin oxide (ITO) using femtosecond laser is disclosed, which comprises steps of: (a) providing a substrate with an amorphous ITO layer thereon; (b) transferring the amorphous ITO layer in a predetermined area into a crystalline ITO layer by emitting a femtosecond laser beam to the amorphous ITO layer in the predetermined area; and (c) removing the amorphous ITO layer on the substrate using an etching solution.

20 Claims, 4 Drawing Sheets

METHOD FOR PATTERNING CRYSTALLINE INDIUM TIN OXIDE USING FEMTOSECOND LASER

BACKGROUND OF THE INVENTION

1. Field of the Invention

The present invention generally relates to a method for patterning crystalline indium tin oxide and, more particularly, to a method for patterning crystalline indium tin oxide using femtosecond laser.

2. Description of the Prior Art

In order to improve the device characteristic of the optoelectronic products such as solar cells and flat-panel displays, the amorphous material such as the transparent conductive oxide has to be transferred by thermal treatment into crystalline material so as to reduce the resistivity and enhance the transparency. Generally, six runs of process (five for pattern transfer and one for thermal treatment) are required to complete the crystalline pattern.

To overcome the problems due to the multi-step and high-cost process, laser machining is used in some processing steps to ablate the undesired portion of the thin films. However, convention long pulse laser results in thermal effects to cause elevated ridges on the edge and defects in the layers below. Even though the precision can be improved by using femtosecond laser, the machining efficiency is reduced because of lowered laser intensity to avoid the thermal effects. The currently available femtosecond laser machining is problematic in that high-precision crystalline pattern cannot be formed with high efficiency because high-speed laser machining using increased laser intensity may bring forth thermal effects to cause elevated ridges on the edge.

In U.S. Pat. No. 6,593,593, Nd:YAG laser is used to ablate the zinc oxide (ZnO) and ITO thin films. As shown in FIG. 1, a glass layer 12, an ITO layer 13 and a ZnO layer 14 are formed on a transparent substrate 11. 1064-nm laser is used to ablate the ZnO layer 14 and the ITO layer 13. However, such laser machining suffers from poor precision and thermal effects to cause elevated ridges on the edge and defects in the layers below. Moreover, precision laser optic system for patterning fine line pitch is costly.

In U.S. Pat. No. 6,448,158, excimer laser is used for thermal annealing. As shown in FIG. 2, a laser source 20 is used to emit a 248-nm excimer laser beam 21. The excimer laser beam 21 passes through a beam homogenizer 22, a mask 23 and a focusing lens 24 to perform machining on an ITO layer 27 on a glass substrate 26 disposed on a movable platform 25. However, in this patent, thermal effects resulting from the long-pulse laser lead to poor patterning precision. Moreover, a mask is needed and the patterning of fine line pitch is not available because the precision is limited by the optic diffraction limits.

Therefore, there is need in providing a method for patterning crystalline indium tin oxide using femtosecond laser to make the most of femtosecond laser machining.

SUMMARY OF THE INVENTION

It is an object of the present invention to provide to a method for patterning crystalline indium tin oxide using femtosecond laser, wherein femtosecond laser with high repetition rate is used with a focusing device to heat up amorphous ITO to achieve high-precision patterning of ITO without thermal treatment and mask.

In order to achieve the foregoing object, the present invention provides a method for patterning crystalline indium tin oxide using femtosecond laser, comprising steps of:

(a) providing a substrate with an amorphous ITO layer thereon;

(b) transferring the amorphous ITO layer in a predetermined area into a crystalline ITO layer by emitting a femtosecond laser beam to the amorphous ITO layer in the predetermined area; and (c) removing the amorphous ITO layer on the substrate using an etching solution.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified but not limited by the preferred embodiment as described hereinafter.

Figure 1:
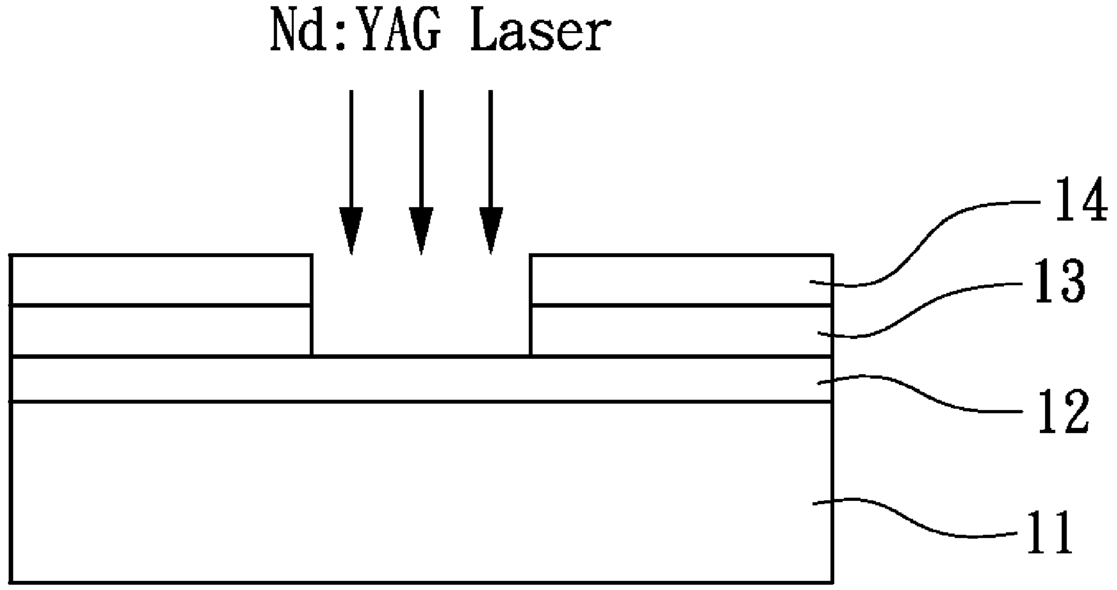
FIG. 1 is a schematic diagram showing the disclosure in U.S. Pat. No. 6,593,593.
Figure 2:
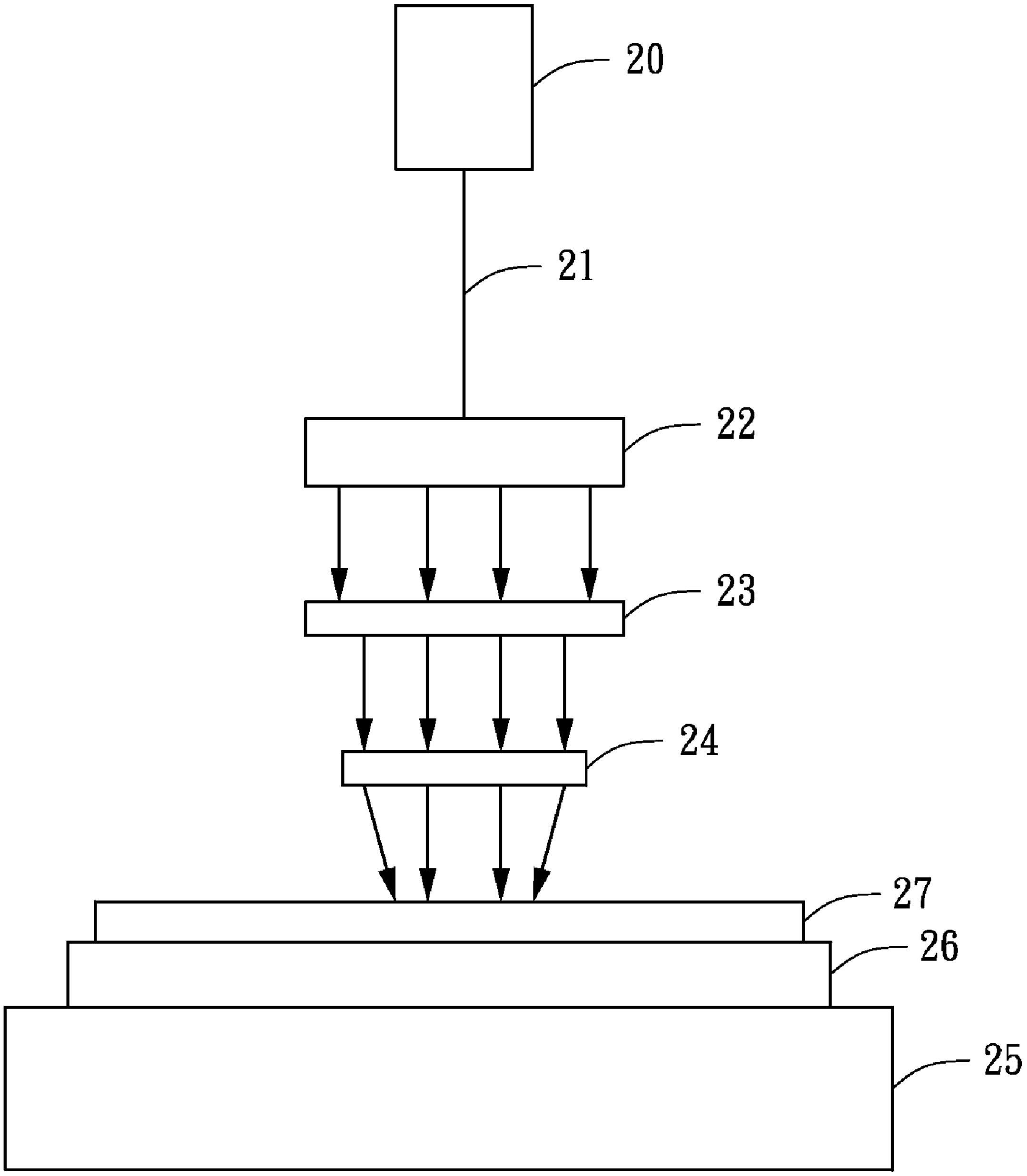
FIG. 2 is a schematic diagram showing the disclosure in U.S. Pat. No. 6,448,158.
Figure 3:
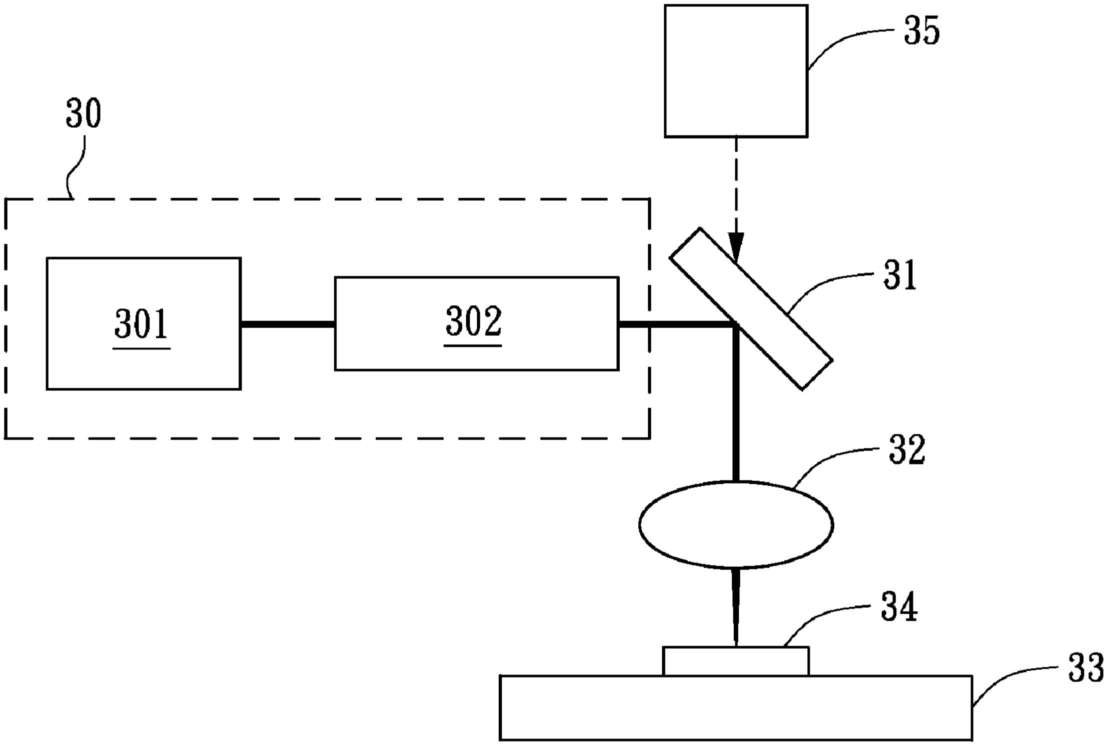
FIG. 3 is a system diagram for transferring amorphous ITO into crystalline ITO according to the present invention.

Please refer to FIG. 3, which is a system diagram for transferring amorphous ITO into crystalline ITO according to the present invention. The system comprises a femtosecond laser apparatus 30, a lens 31, a focusing lens set 32 and a carrier 33. The femtosecond laser apparatus 30 comprises a femtosecond laser source 301 and a beam adjustment device 302 capable of adjusting the laser intensity. The lens 31 is capable of changing the laser path. The focusing lens set 32 is capable of focusing the laser beam. The carrier 33 is capable of moving relatively to the femtosecond laser apparatus 30 and carrying a substrate 34 with an amorphous ITO layer (not shown) formed thereon. Therefore, after the femtosecond laser apparatus 30 is turned on, the laser beam is reflected by the lens 31 and focused by the focusing lens set 32 to illuminate the substrate 34 on the carrier 33. The amorphous ITO layer on the substrate 34 is heated up after laser illumination. As the laser intensity exceeds the intensity threshold for crystallization, the amorphous ITO layer is transferred into a crystalline ITO layer. Meanwhile, the carrier 33 is capable of moving relatively to the femtosecond laser apparatus 30 so that patterned crystalline ITO can be formed on the substrate 34. To better observe the surface of the crystalline ITO layer, a charge-coupled device (CCD) camera 35 is provided as shown in FIG. 3.

Afterwards, an acid solution is used to remove the amorphous ITO layer on the substrate 34. In the present invention, 50° C. oxalic acid heated up for less than 5 minutes is used to remove the amorphous ITO layer. Alternatively, nitro-hydrochloric acid, hydrochloric acid or the like can also be used as an etching solution to remove the amorphous ITO layer.

Figure 4:
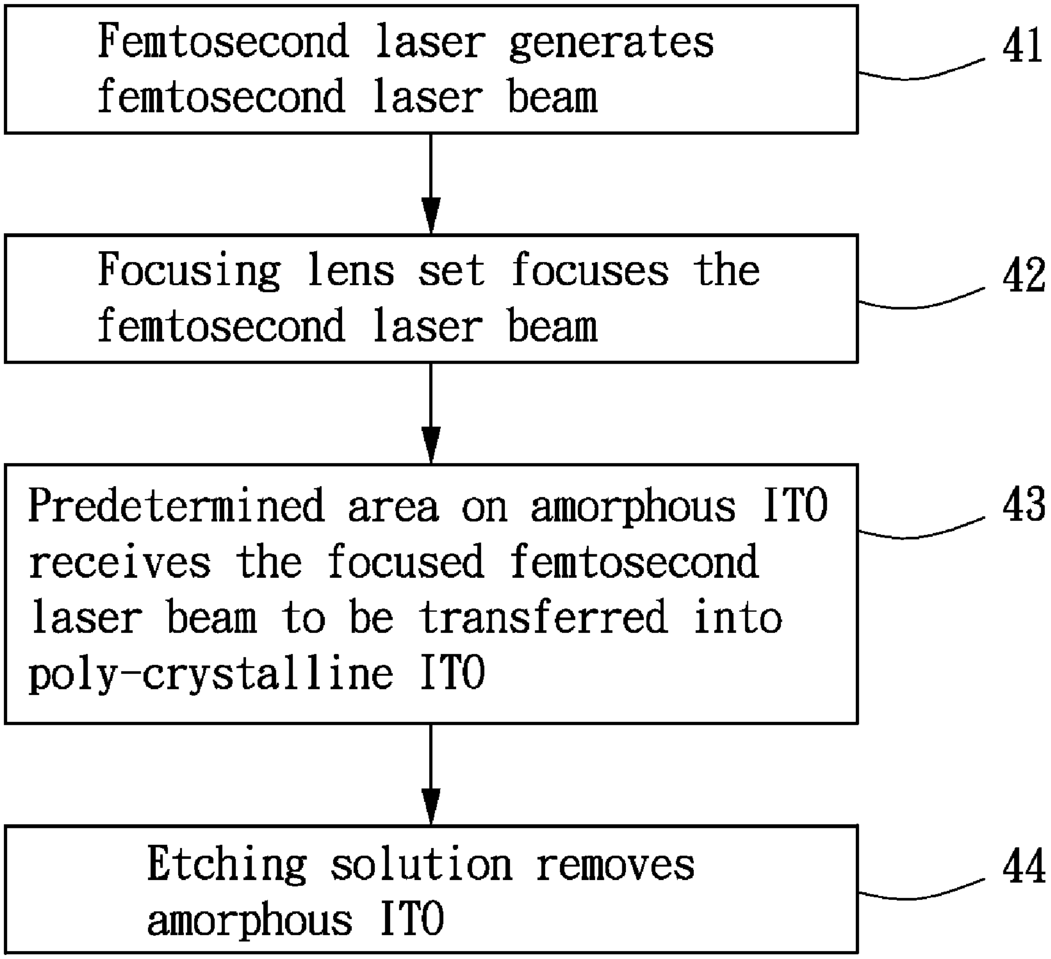
FIG. 4 is a flowchart of a method for patterning crystalline indium tin oxide using femtosecond laser according to the present invention.

Therefore, the method for patterning crystalline indium tin oxide using femtosecond laser of the present invention comprises steps as described in FIG. 4.

In Step 41, femtosecond laser is used to generate a femtosecond laser beam, the intensity of which can be adjusted by a beam adjustment device.

In Step 42, the femtosecond laser beam is focused by a focusing lens set.

In Step 43, an amorphous ITO layer in a predetermined area is illuminated by the focused femtosecond laser beam and is transferred into a crystalline indium-tin oxide layer. The predetermined area is the desired pattern. In this step, a relative movement between the carrier and the femtosecond laser beam is activated. For example, the carrier is fixed while the femtosecond laser beam is moved; otherwise, the femtosecond laser beam is fixed while the carrier is moved.

In Step 44, the amorphous ITO layer on the substrate is removed by an etching solution to obtain a patterned crystalline indium-tin oxide layer.

In the present invention, the substrate is glass or plastic. The thickness of the amorphous ITO layer on the substrate is preferably within a range from 50 to 500 nm. The wavelength of the femtosecond laser source is preferably within a range from 100 to 2000 nm. The pulse width is no larger than 500 fs and the repetition rate is no less than 100 kHz. The focusing lens set comprises a plurality of lenses so that the focused femtosecond laser beam intensity is within the range from 0.01 to 0.2 J/cm$^2$.

Theoretically, a relation between the focused femtosecond laser beam intensity and the line width of the formed crystalline ITO pattern is expressed as:

$$D^2=2\omega^2\ln(F/F_{th})$$

wherein D is the line width of the crystalline ITO pattern, ω is the light spot radius of the focused femtosecond laser beam, F is the focused femtosecond laser beam intensity, and $F_{th}$ is the intensity threshold of thermal crystallization of amorphous ITO. Therefore, as long as the intensity and the size of the focused light spot of the femtosecond laser beam are controlled, the desired line width of a crystalline ITO layer can be obtained.

With the method for patterning crystalline ITO disclosed in the present invention, the line width D of the crystalline ITO pattern is smaller than the light spot diameter 2ω of the focused femtosecond laser beam, which exceeds the limit of optical diffraction.

Accordingly, the present invention discloses a method for patterning crystalline indium tin oxide using femtosecond laser with direct write to achieve high-precision patterning without mask and thermal treatment. Therefore, the present invention is useful, novel and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for patterning crystalline indium tin oxide using femtosecond laser, comprising steps of:

(a) providing a substrate with an amorphous ITO layer thereon;

(b) transferring the amorphous ITO layer in a predetermined area into a crystalline ITO layer by emitting a femtosecond laser beam to the amorphous ITO layer in the predetermined area;

generating the femtosecond laser beam using a femtosecond laser source;

focusing the femtosecond laser beam using a focusing lens set; and transferring the amorphous ITO layer in the predetermined area into the crystalline ITO layer by emitting the focused femtosecond laser beam to the amorphous ITO layer in the predetermined area; and (c) removing the amorphous ITO layer on the substrate using an etching solution wherein the relation between the intensity F of the focused femtosecond laser beam and the pattern line width D of the crystalline indium-tin oxide layer satisfies $D^2=2\omega^2\ln(F/Fth)$, wherein ω is the light spot radius of the focused femtosecond laser beam and Fth is the intensity threshold for thermal crystallization of amorphous ITO.

2. The method for patterning crystalline indium tin oxide using femtosecond laser as recited in claim 1, wherein the thickness of the amorphous ITO layer is within a range from 50 to 500 nm.

3. The method for patterning crystalline indium tin oxide using femtosecond laser as recited in claim 1, wherein the substrate is glass or plastic.

4. The method for patterning crystalline indium tin oxide using femtosecond laser as recited in claim 1, further comprising a carrier capable of carrying the substrate.

5. The method for patterning crystalline indium tin oxide using femtosecond laser as recited in claim 4, wherein the step (b) further comprises a step of:

activating a relative movement between the carrier and the femtosecond laser beam.

6. The method for patterning crystalline indium tin oxide using femtosecond laser as recited in claim 5, wherein the carrier is fixed while the femtosecond laser beam is moved.

7. The method for patterning crystalline indium tin oxide using femtosecond laser as recited in claim 5, wherein the femtosecond laser beam is fixed while the carrier is moved.

8. The method for patterning crystalline indium tin oxide using femtosecond laser as recited in claim 1, wherein the wavelength of the femtosecond laser source is within the range from 100 to 2000 nm.

9. The method for patterning crystalline indium tin oxide using femtosecond laser as recited in claim 1, wherein the pulse width of the femtosecond laser source is no larger than 500 fs.

10. The method for patterning crystalline indium tin oxide using femtosecond laser as recited in claim 1, wherein the repetition rate of the femtosecond laser source is no lower than 100 kHz.

11. The method for patterning crystalline indium tin oxide using femtosecond laser as recited in claim 1, wherein the focusing lens set comprises at least a lens.

12. The method for patterning crystalline indium tin oxide using femtosecond laser as recited in claim 1, wherein the intensity of the focused femtosecond laser beam is within the range from 0.01 to 0.2 J/cm$^2$.

13. The method for patterning crystalline indium tin oxide using femtosecond laser as recited in claim 1, further comprising a carrier capable of carrying the substrate.

14. The method for patterning crystalline indium tin oxide using femtosecond laser as recited in claim 13, further comprising a step of:

activating a relative movement between the carrier and the femtosecond laser beam.

15. The method for patterning crystalline indium tin oxide using femtosecond laser as recited in claim 14, wherein the carrier is fixed while the femtosecond laser beam is moved.

16. The method for patterning crystalline indium tin oxide using femtosecond laser as recited in claim 14, wherein the femtosecond laser beam is fixed while the carrier is moved.

17. The method for patterning crystalline indium tin oxide using femtosecond laser as recited in claim 1, wherein D is less than 2ω.

18. The method for patterning crystalline indium tin oxide using femtosecond laser as recited in claim 1, wherein the etching solution is oxalic acid.

19. The method for patterning crystalline indium tin oxide using femtosecond laser as recited in claim 1, wherein the etching solution is nitro-hydrochloric acid.

20. The method for patterning crystalline indium tin oxide using femtosecond laser as recited in claim 1, wherein the etching solution is hydrochloric acid.

* * * * *